United States Patent [19]

Nagazumi

[11] Patent Number: 5,539,404
[45] Date of Patent: Jul. 23, 1996

[54] DIGITAL TO ANALOG CONVERTER USING RECURSIVE SIGNAL DIVIDING CHARGE COUPLED DEVICES

[75] Inventor: Yasuo Nagazumi, 6-14-20 Ootsuka, Bunkyo-ku, Tokyo, Japan

[73] Assignees: Yasuo Nagazumi; G.D.S. Co., Ltd., both of Japan; a part interest

[21] Appl. No.: 192,961

[22] Filed: Feb. 7, 1994

[30] Foreign Application Priority Data

Feb. 8, 1993 [JP] Japan .................................. 5-043262
Jun. 2, 1993 [JP] Japan .................................. 5-154514

[51] Int. Cl.⁶ ..................................................... H03M 1/66
[52] U.S. Cl. ............................ 341/150; 341/172; 377/63
[58] Field of Search ..................................... 341/150, 172; 377/59, 62, 63; 326/61; 365/183

[56] References Cited

U.S. PATENT DOCUMENTS

| | | | |
|---|---|---|---|
| 4,072,939 | 2/1978 | Heller et al. | |
| 4,099,175 | 7/1978 | Rubin | 340/347 DA |
| 4,107,670 | 8/1978 | Hornak | 340/347 |
| 4,213,120 | 7/1980 | Buchanan | 340/347 DA |
| 4,369,378 | 1/1983 | Rockett | 307/221 |
| 4,616,334 | 10/1986 | Vogelsong et al. | 364/825 |
| 5,386,115 | 1/1995 | Freidhoff et al. | 250/281 |

FOREIGN PATENT DOCUMENTS 52-106261  6/1977  Japan .

OTHER PUBLICATIONS

J. Hon, "Multiple–Valued VLSI and Systoric Arrey with CCD Realization", vol. 3, pp. 67–118, 1989.
R. E. Sua'res, et al., "All–MOS charge redistribution Analog–to–Digital conversion techniques Part II", pp. 379–385, Dec. 1975.
A. M. Chiang, "A CCD Programmable Signal Processor", vol. 25, No. 6, pp. 1510–1517, Dec. 1990.

Primary Examiner—Jeffrey A. Gaffin
Assistant Examiner—Jason Kost
Attorney, Agent, or Firm—King & Schlickli

[57] ABSTRACT

Analog memories such as CCD, which are advantageous in less power consumption and higher integration density, are used to configure a system for highly accurately executing digital/analog processing. A digital to analog converter according to the invention has at least one first analog memory having an input port for receiving input signal packets and a partial output drive port for driving the i-th output signal packet; at least one second analog memory having a function to integrate input signal packets applied thereto; and at least one signal packet routing mechanism for selectively routing output signal packets from the first analog memory according to an input digital signal bit. The extremely simple configuration of the present invention may be effectively utilized for realizing an ultra-parallel analog processor as well as applied to other fields such as video processing by combining a function of an input means for optical signals, which has been a main application of the CCD.

18 Claims, 9 Drawing Sheets

DIGITAL INPUT

BASIC ELEMENTS

RECURSIVE DIVIDER

DIGITAL TO ANALOG CONVERTER USING RECURSIVE SIGNAL DIVIDING CHARGE COUPLED DEVICES

BACKGROUND OF THE INVENTION

1. Field of the Invention

The present invention relates to analog/digital information processing, and more particularly to digital-to-analog (D/A) converting techniques which can execute multiplication processing in a high accuracy by use of analog memories.

Although the present invention is principally utilized in D/A converters and particularly described herein in connection therewith, it should be understood that the present invention may be widely applied to a neural network circuit, a multiplier circuit, a signal processor and so on.

2. Description of the Related Art

While analog memory devices represented by a charge coupled device (CCD) and other charge transfer devices (CTD) have been widely spread in the form of imaging devices and delay lines, they are merely applied to limited fields of their original uses such as analog shift registers, analog memories and so on. Although the utilization of these analog memory devices in matched filters and multi-value logic circuits have been investigated, very few applications have been actually realized in the field of signal processing.

In general, the CCD has excellent characteristics such as less power consumption and high density of integration, so that the establishment of higher signal processing functions such as multiplication has been expected. However, very few specific approaches have been proposed for the present except for several examples, as will be mentioned below.

Figure 1:
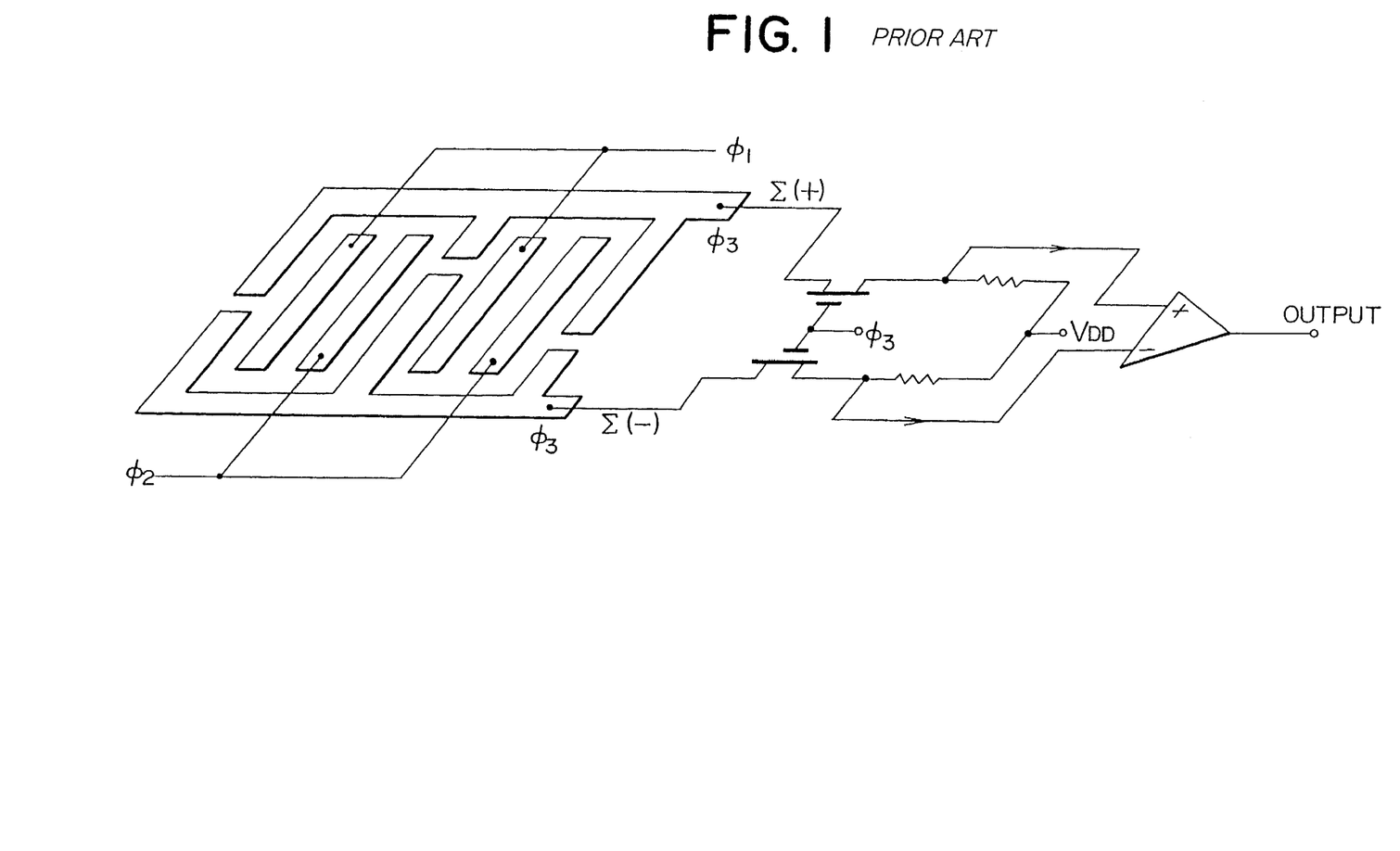
FIG. 1 is a schematic circuit diagram showing an example of the prior art CCD matched filter.

FIG. 1 shows in a schematic circuit diagram form an example of conventional CCD matched filters. The illustrated CCD matched filter adjusts the filter characteristics by a pair of floating electrode groups placed on a CCD analog shift register. Also, interactions between charge signals and the electrode areas on individual stages are indirectly utilized to parallelly execute analog multiplications at the respective stages, so that the calculating speed is relatively high. However, since errors in the electrode area directly affect the multiplication accuracy, the multiplication accuracy apparently tends to decrease as the miniaturization of circuits is advanced. It will therefore be understood that there is a certain limit in the highly dense integration.

As for the application of the CCD to multiple-valued logic circuits, basic logic processing is currently being investigated. A prospect of realizing high-grade processing, such as a multiplier utilizing the CCD as shown in FIG. 1, seems to be still indefinite. The application of the CCD in this field is described in an article entitled "Multiple-Valued VSLI and Systolic Array with CCD Realization" by J. Han, Progress in Computer-Aided VLSI Design, Vol. 3, Implementations, pp. 67–118, Ablex Publishing, Norwood, N.J., USA, 1989.

Figure 2:
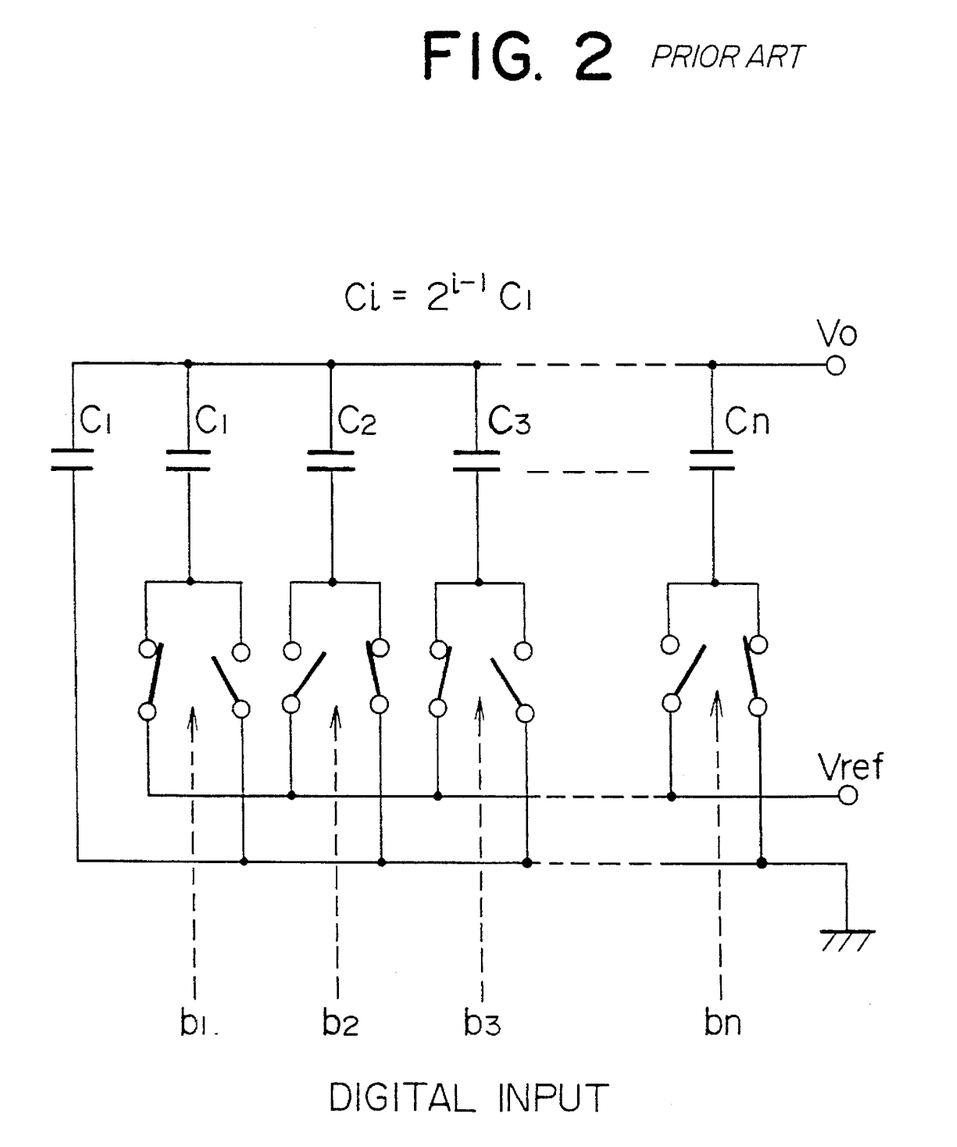
FIG. 2 is a circuit diagram showing a prior art A/D converter to which a switched capacitor circuit is applied.

Although not included in the charge transfer device, there has been proposed and commercialized a method of realizing D/A and A/D conversion based on the charge redistribution principle by applying "a switched capacitor circuit" which utilizes capacitance for an analog memory to perform signal processing (FIG. 2). However, with the switched capacitor circuit, it is indispensable to repetitively recharge and discharge capacitors in the circuit using a stable voltage source, so that required power consumption is much larger than that of the charge transfer device such as CCD. For this reason, it is generally thought that the implementation of the switched capacitor circuit in a high density integrated circuit and the enhancement of the operating speed are limited. The switched capacitor circuit further implies a number of disadvantages. For example, it cannot execute D/A conversion with a charge signal used directly as a reference signal. For further details about the switched capacitor circuit, refer to an article entitled "All-MOS Charge Redistribution Analog-to-Digital Conversion Techniques, Part II", by R. E. Sua'res, et al, IEEE, J. Solid-state Circuits, SC-10, 6. pp. 379–395 (Dec. 1975).

In addition, charge domain devices (CDD) have also been developed and studied for the purpose of analog signal processing such as a product sum operation for IIR (Infinite Impulse Response), FIR (Finite Impulse Response) and so on.

A technique employed for this processing is multiplication by a fixed coefficient. Specifically, a charge splitting technique constitutes the basis in which input charges are divided in a constant ratio in a charge domain. This technique is described in detail in an article entitled "Charge Packet Splitting in Charge Domain Devices" by S. S. Bencuya and A. J. Steckl, IEEE Trans. Electron Devices, Vol. ED-31, No. 10, pp 1494–1501, 1984. The disclosure of this article is herein incorporated by reference.

As described also in the above-mentioned article, the charge dividing ratio is extremely critical in this technique. Since the accuracy of the division depends on the geometric accuracy of a splitter, a larger splitter is required for achieving a higher accuracy. However, according to the article, even a large splitter having the width of 250 µm merely provides an accuracy of approximately 0.18% (when divided in 1:1).

A multiplier based on the above-mentioned technique has drawbacks in that its charge dividing ratio is fixed and not adjustable, and a high accuracy is difficult to achieve. Thus, this technique is not advantageous over the digital signal processor (DSP), and therefore has been hardly widespread at present.

Further, investigations on a neural network using CCD has also been promoted. An example is described in "A CCD Programmable Signal Processor" by Alice M. Chiang, IEEE J. Solid-state Circuits, Vol. 25, No. 6, December 1990. The disclosure of this article is herein incorporated by reference.

This example employs a scheme in which a multiplication type D/A converter using the CCD technique is utilized as a multiplier, and an analog signal is multiplied by a digital coefficient. However, in Chiang, an input signal is not supplied as charges but as an analog voltage, and input gates having ratios of $1, 2, 4, \ldots, 2^{n-1}$, respectively, are parallelly disposed and respectively controlled by digital signal bits. With this configuration, there is a drawback in that a multi-bit operation requires a large dimension of the device so that highly integrated devices cannot be expected. Also, since charge inputs cannot be directly processed, the accuracy will be limited at a relatively low value.

SUMMARY OF THE INVENTION

In view of the above-mentioned problems of the prior art, it is a principal object of the present invention to provide a circuit which is capable of realizing a highly accurate analog multiplication with a simple configuration by directly multiplying a digital signal with a charge signal transmitted by a charge transfer device.

To achieve the above object, the present invention provides a digital to analog converter comprising: at least one first analog memory means having an input port for receiving input signal packets (Qin) and a partial output drive port for driving the i-th output signal packet (Qout(i)) defined by:

$$Qout(i)=Qin \cdot (1-a)^{i-1} \cdot a$$

where a is a value satisfying 1>a>0, and i=1, 2, 3 ...; at least one second analog memory means having a function to integrate input signal packets applied thereto; and at least one signal packet routing mechanism for selectively routing output signal packets from the first analog memory means according to an input digital signal bit (d(i)).

Since the circuit according to the present invention is formed by a less number of elements, a great number of the circuit can be incorporated in an integrated circuit. This leads to the formation of a programmable parallel analog processor for parallelly executing operations of the sum of products, which can be applied, for example, to the fields of neural network and image processing.

The above and other objects, features and advantages of the present invention will be more apparent from the following detailed description of the preferred embodiment when read in conjunction with the accompanying drawings.

DESCRIPTION OF THE PREFERRED EMBODIMENTS

Present invention will hereinafter be described in connection with the preferred embodiments thereof with reference to the accompanying drawings.

Figure 3A:
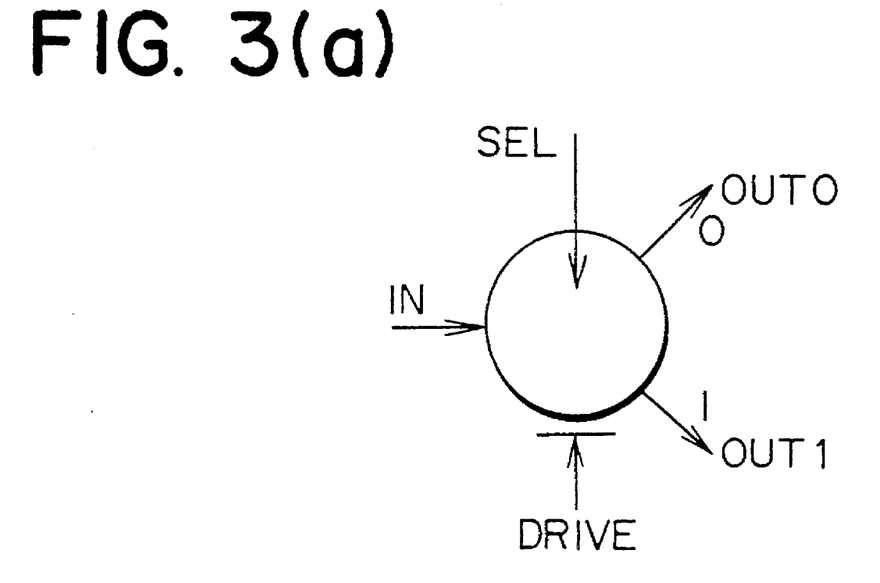
FIGS. 3A–3B show in schematic diagram form functional elements which constitute the circuits of the present invention.
Figure 3B:
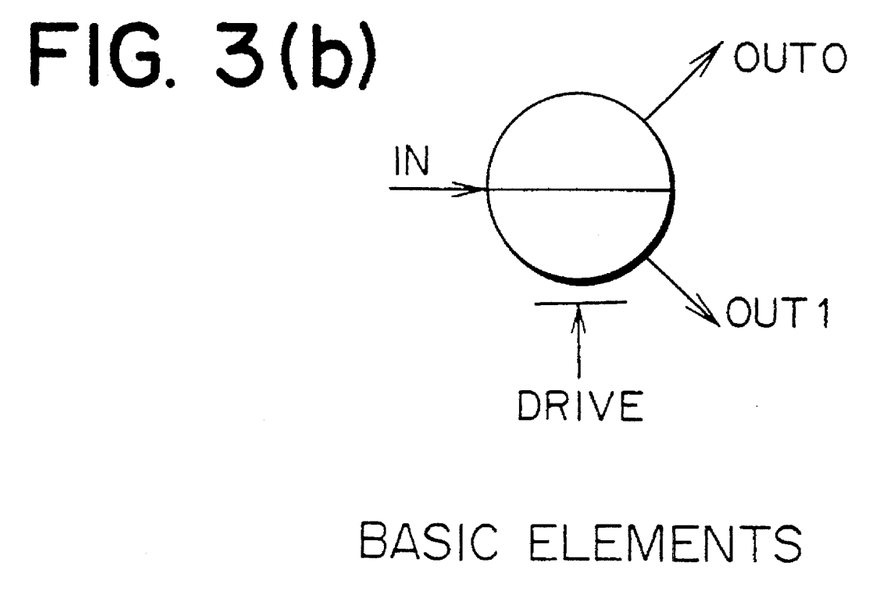

FIGS. 3A–3B show symbols and functions of functional elements which constitute the present invention. Specifically, FIG. 3A illustrates a buffer gate (BG) having an output selection function. As illustrated, a signal inputted from an input port IN is added to a signal which has already been held in the buffer gate. The signal held in the gate is all outputted from either of output poets OUT0 and OUT1 in response to an output control signal DRIVE. However, the selection of the output port is made by an output selecting signal SEL. It will be of course understood that a buffer gate having a single output port does not require the SEL input.

FIG. 3B illustrates a signal dividing gate (DG). A signal inputted from an input port IN is all delivered from output ports OUT0 and OUT1 in response to an output control signal DRIVE, wherein the ratio of the amounts of the two output signals delivered from the ports OUT0 and OUT1 indicates substantially a constant value.

FIGS. 4A–4G illustrate examples of recursive dividers (RD) utilizing the signal dividing gate of FIG. 3B and the operation thereof.

Figure 4A:
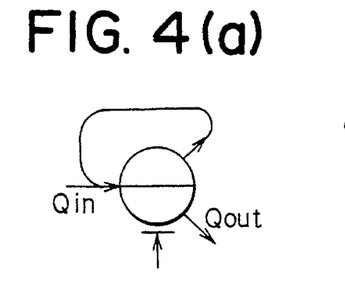
FIG. 4A is a schematic diagram showing an embodiment of a recursive divider according to the present invention.

More specifically, in FIG. 4A showing the basic configuration of a recursive divider, one of two output signals delivered from a dividing gate is directed to the outside, whereas the other output is again used as an input to the dividing gate. For this reason, assuming that the output ratio of the dividing gate is represented by (1−a):a, the i-th output QOUT of the dividing gate is expressed by the following equation (1):

$$QOUT(i)=QIN \cdot (1-a)^{i-1} \cdot a \qquad (1)$$

where QIN is the initial signal amount, and a is a value larger than zero and smaller than one (1>a>0).

In the equation (1), if a is assumed to be ½, the equation (1) is of course simplified as expressed by the following equation (2):

$$QOUT(i)=QIN \cdot (\tfrac{1}{2})^i \qquad (2)$$

Figure 4B:
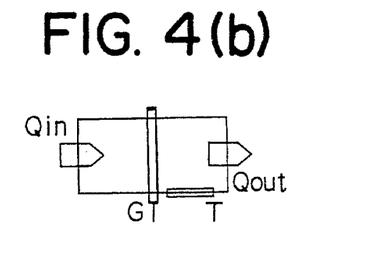
FIG. 4B illustrates a specific configuration of a recursive divider of the type shown in FIG. 4A employing CCD as an analog memory.

FIG. 4B shows an example of a configuration which utilizes CCD as an analog memory and locates a separation gate G at a position where the area of the separation gate G is substantially equally divided into two, such that charge signals are repetitively divided into two equal portions. An electrode T shown in the drawing is an adjusting electrode provided for finely adjusting the dividing ratio of signals and is structured to control the area ratio of the gate by use of an external electric field.

It should be noted here that while there are a variety of specific forms for realizing data transfer between analog memories, e.g., three-phase type, four-phase type and so on only for the CCD, the difference among these forms is not related to the essence of the present invention. Since the complexity caused by these different forms merely prevents the understanding of the present invention, the data transfer will be represented by fat arrows in the explanation below.

Figure 4C:
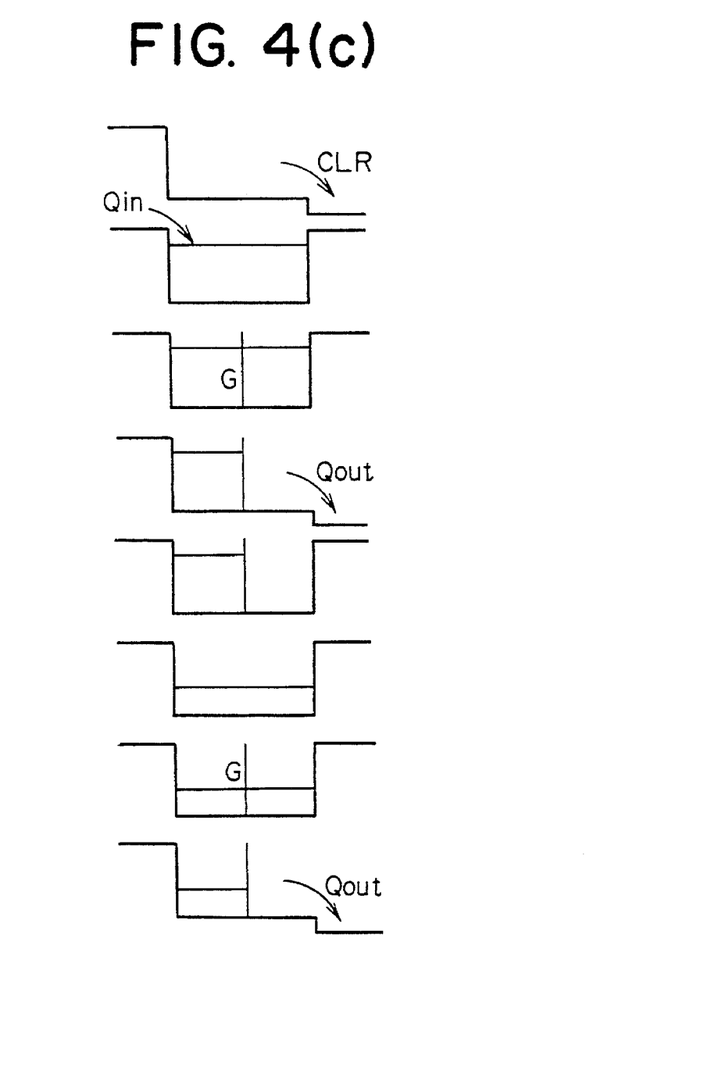
FIG. 4C schematically illustrates the operation of the recursive divider according to the present invention.

FIG. 4C schematically shows a series of the operation of a recursive divider. In the topmost figure, the recursive divider is initialized by discharging all signals contained therein. In the second figure representing the second stage, an input signal is injected into the recursive divider. In the third figure or the third stage, the input signal is divided by a gate G in a predetermined ratio, where one-half the input signal is discharged while the rest is redistributed over the whole recursive divider when the gate G is removed.

The foregoing equation (1) is realized by repeating the division, discharge and redistribution.

Figure 4D:
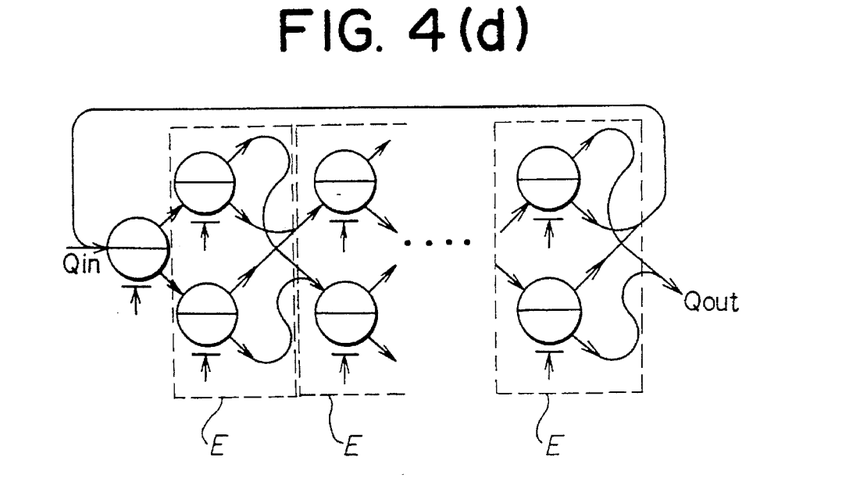
FIG. 4D is a schematic diagram showing another embodiment of the recursive divider according to the present invention.

FIG. 4D shows an alternative idea for configuring an accurate recursive divider ($a=\frac{1}{2}$) by using a multiplicity of dividing gates. Assuming that all dividing gates in the drawing output ($\frac{1}{2}+x$) and ($\frac{1}{2}-x$) of signals held in the respective dividing gates (x is an error coefficient), the outputs of the dividing gate at the first stage are expressed by the following equation (3):

$$Q(1)=QIN\cdot(\tfrac{1}{2}+x)$$

$$Q'(1)=QIN\cdot(\tfrac{1}{2}-x) \quad (3)$$

If these outputs are further divided by dividing gates in the next stage, Q(1) is divided into Q00 and Q01, while Q' (1) into Q10 and Q11. Thus, the following four signals are outputted:

$$Q00=QIN\cdot(\tfrac{1}{2}+x)\cdot(\tfrac{1}{2}+x)$$

$$Q01=QIN\cdot(\tfrac{1}{2}+x)\cdot(\tfrac{1}{2}-x)$$

$$Q10=QIN\cdot(\tfrac{1}{2}-x)\cdot(\tfrac{1}{2}+x)$$

$$Q11=QIN\cdot(\tfrac{1}{2}-x)\cdot(\tfrac{1}{2}-x) \quad (4)$$

Then, each two of the four signals are next collected as expressed by the following equations (5):

$$Q(2)=Q00+Q11=QIN\cdot(\tfrac{1}{2}+2x^2)$$

$$Q'(2)=Q01+Q10=QIN\cdot(\tfrac{1}{2}-2x^2) \quad (5)$$

It will be understood from the foregoing equations that $x>2x^2$ is satisfied when $0<|x|<0.5$, and that an error in the results is ensured to be gradually improved.

As described above, the expressions (4) and (5) show a process for reducing an error by multiplying the original division error X by 2x and further equalizing the sizes of two input packets. Therefore, the process is referred to as a charge equalizing process.

Moreover, the hardware for executing the above process, as shown by the blocks enclosed by a broken line in FIG. 4(d), corresponds to the dividers at the i-th stage and the adder for adding the outputs of the dividers. Therefore, the hardware is referred to as an equalizer.

The error is improved as the foregoing processes are repeated and, as a result, expressed generally by the following equations (6):

$$Q(i)=QIN\cdot\{1+(2x)^i\}/2$$

$$Q'(i)=QIN\cdot\{1-(2x)^i\}/2 \quad (6)$$

Figure 4E:
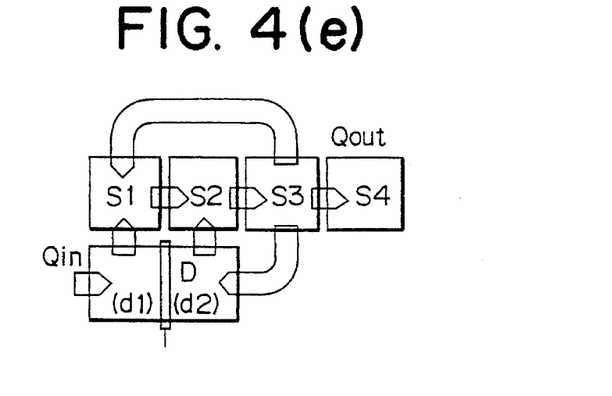
FIG. 4E illustrates an exemplary configuration of the recursive divider shown in FIG. 4D employing CCD's.

FIG. 4E shows an example of a configuration for realizing the processes executed by the configuration illustrated in FIG. 4D, the operation of which will be explained later with reference to FIG. 5.

Figure 4F:
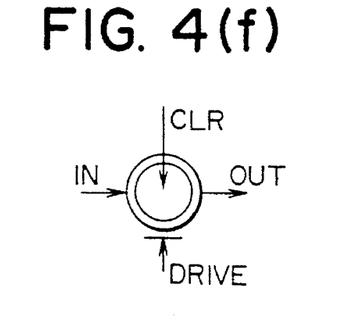
FIG. 4F shows a symbol representing the function of the recursive divider.
Figure 4G:
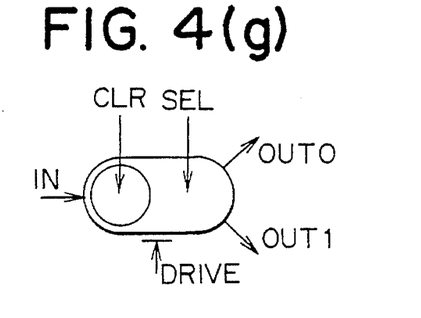
FIG. 4G illustrates a further embodiment of the recursive divider according to the present invention.

It is assumed hereinafter that the function of the above-mentioned recursive divider is represented by a symbol shown in FIG. 4F. A symbol shown in FIG. 4G represents a recursive divider which has two output paths, the selection of which is made in accordance with a SEL signal similarly to that shown in FIG. 3A.

Figure 5:
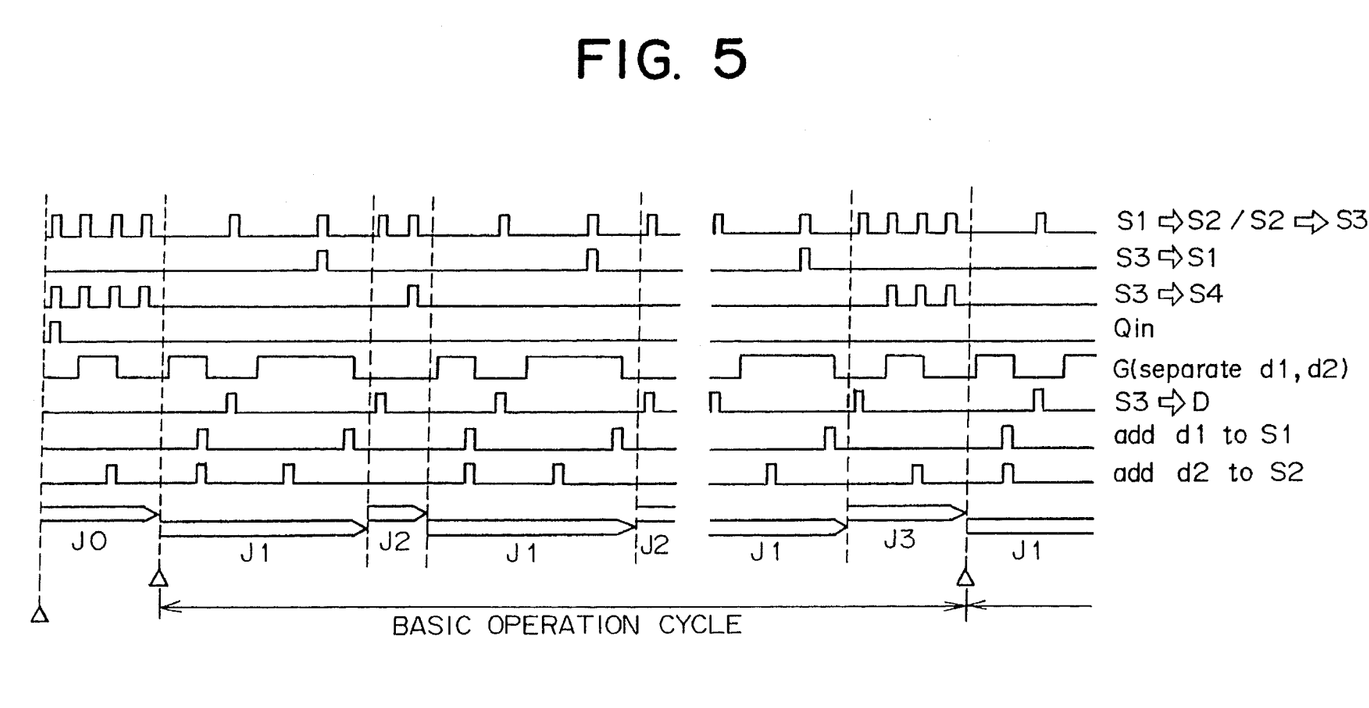
FIG. 5 shows timing charts used for explaining the operation of the recursive divider of FIG. 4.

FIG. 5 shows the operation of the multiple division type recursive divider in accordance with the configuration of FIG. 4E with respect to the time.

The configuration shown FIG. 4E comprises a recursive shift register including three buffer gates S1, S2, S3, each functioning as a memory and an output buffer gate S4. The operation of the whole configuration is made up of a combination of an input phase J0, division phases J1, J2, and an output phase J3. Among them, J1 corresponds to one line of the above-described charge equalizing process.

More specifically, input charges are transferred to a dividing gate D at a timing of the first pulse. The dividing gate D divides the input charges into two segments on d1, d2, respectively, and the segment on d2 only is transmitted to a memory S2, the contents of which is moved into a memory S3 by its shift operation. In the meantime, the dividing operation of the dividing gate D is removed, the segment on d1 is re-distributed to the entire part of the dividing gate D, whereby the second division is ready.

The second division is made up of two phases. In the first phase, the signal remaining in the dividing gate D is again divided into segments on d1, d2 which are accumulated in the memories S1, S2, respectively. Then, the segment on d2 held in the memory S3 as the result of the first division is again transferred to the dividing gate D by a shift operation.

In the second phase, the contents of the dividing gate D, i.e., the segment on d2 resulted from the first division, is again divided into two segments on d1, d2. The second segment on d2 is added to the contents of the memory S2, while the second segment on d1 is added to the contents of the memory S1 by an additional shift operation, thus forming an output. Simultaneously with this operation, two shift operations are executed for the next division.

With this configuration, after the processing of the division phases J1+J2 have been executed a number of times determined by a required accuracy of division, the first part of the division phase J1 and the output phase J3 are further executed to complete a division output. While more processing time is taken for a higher accuracy required, no additional processing such as calibration is necessary, so that the hardware configuration can be made simple. In addition, the accuracy of division may be selected depending on its applications.

Figure 6A:
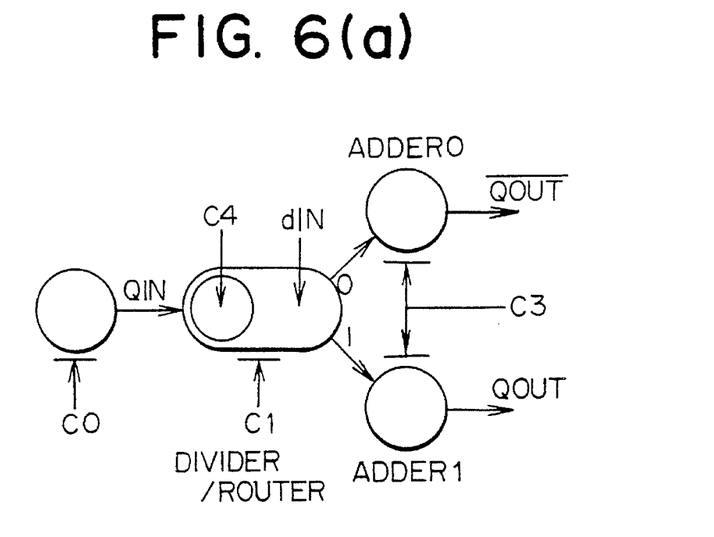
FIG. 6A shows a basic configuration depicting one embodiment of the two-quadrant multiplier.
Figure 6B:
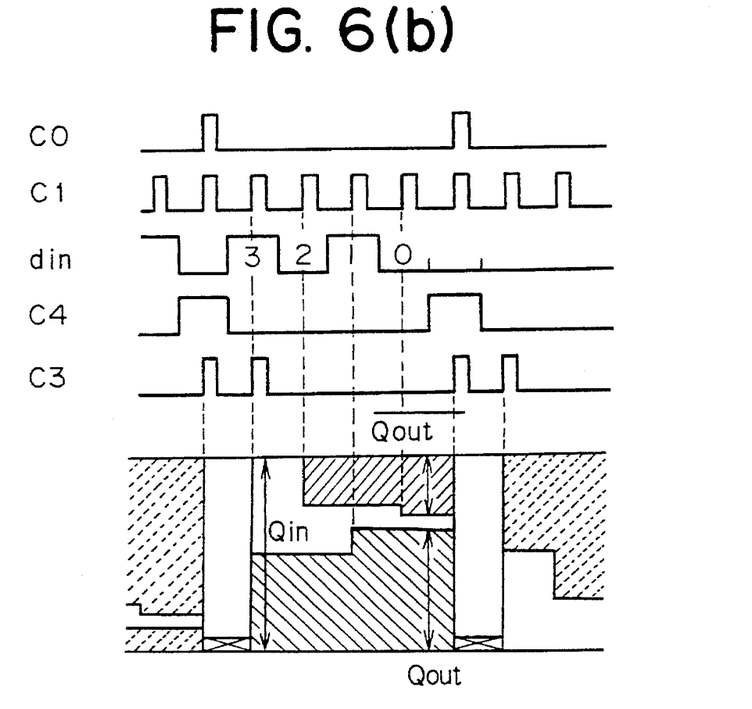
FIG. 6B shows timing charts illustrating the operation of the two-quadrant multiplier of FIG. 6A.

Next, a two-quadrant multiplier according to the present invention will be described with reference to FIGS. 6A–6B. FIG. 6A shows a basic configuration depicting one embodiment of the two-quadrant multiplier; and FIG. 6B shows timing charts illustrating the operation of the two-quadrant multiplier of FIG. 6A.

More specifically, the configuration of FIG. 6A employs two buffer gates spatially independent of each other as adders (ADDER0, ADDER1), wherein the output of a recursive divider is selectively supplied to one of the adders by a digital signal dIN such that the output is added by the selected adder. A signal QIN fed from the left of the recursive divider is maintained therein, and a partial output signal QOUT(i) is driven by a drive signal C1 and supplied to ADDER0 when the signal dIN is zero and to ADDER1 when the signal dIN is one, such that the output signal QOUT(i) is accumulatively added by the respective adders.

It is assumed in this event that the digital signal bit dIN is supplied to the recursive divider as a serial signal which has the most significant bit as 1-st bit.

Setting the division ratio a of the recursive divider to ½, its output depends on the foregoing equation (2).

Supposing herein that an n-bit digital signal dIN (dn-1, dn-2, ... d2, d1, d0) with d0 being the least significant bit (LSB) is a digital input, the divided output signal derived by the equation (2) is selected by the each bit constituting the digital signal dIN, and bits having one only are accumulated. This operation is expressed by the equation (7) below:

$$QOUT = QIN \cdot \sum_{i=0}^{n-1} \{2^{(i-n)} \cdot di\} \quad (7)$$

This equation means that QOUT0 is an output corresponding to the product of the charge amount QIN and the digital value dIN.

Likewise, an operation of accumulating bits having zero is expressed by the equation (8):

$$\overline{QOUT} = QIN \cdot \sum_{i=0}^{n-1} \{2^{(i-n)} \cdot (1 - di)\} \quad (8)$$

When a 4-bit dIN is employed to calculate the relationships between dIN and the analog input/output ratio QOUT/QIN, $\overline{QOUT}$/QIN, the following Table 1 results.

TABLE 1

Relationships between Digital Data and Corresponding Outputs

| Digital Code | | | | | QOUT/ | $\overline{QOUT}$/ | (QOUT − $\overline{QOUT}$)/ |
|---|---|---|---|---|---|---|---|
| d3 | d2 | d1 | d0 | dIN | QIN | QIN | QIN |
| 0 | 0 | 0 | 0 | 0 | 0 | 15/16 | −15/16 |
| 0 | 0 | 0 | 1 | 1 | 1/16 | 14/16 | −13/16 |
| 0 | 0 | 1 | 0 | 2 | 2/16 | 13/16 | −11/16 |
| 0 | 0 | 1 | 1 | 3 | 3/16 | 12/16 | −9/16 |
| 0 | 1 | 0 | 0 | 4 | 4/16 | 11/16 | −7/16 |
| 0 | 1 | 0 | 1 | 5 | 5/16 | 10/16 | −5/16 |
| 0 | 1 | 1 | 0 | 6 | 6/16 | 9/16 | −3/16 |
| 0 | 1 | 1 | 1 | 7 | 7/16 | 8/16 | −1/16 |
| 1 | 0 | 0 | 0 | 8 | 8/16 | 7/16 | 1/16 |
| 1 | 0 | 0 | 1 | 9 | 9/16 | 6/16 | 3/16 |
| 1 | 0 | 1 | 0 | A | 10/16 | 5/16 | 5/16 |
| 1 | 0 | 1 | 1 | B | 11/16 | 4/16 | 7/16 |
| 1 | 1 | 0 | 0 | C | 12/16 | 3/16 | 9/16 |
| 1 | 1 | 0 | 1 | D | 13/16 | 2/16 | 11/16 |
| 1 | 1 | 1 | 0 | E | 14/16 | 1/16 | 13/16 |
| 1 | 1 | 1 | 1 | F | 15/16 | 0 | 15/16 |

It can be seen from Table 1 that the output QOUT of the adder gate ADDER0 in this configuration is a value derived by multiplying QIN by dIN, and the output $\overline{QOUT}$ of the adder gate ADDER1 is in complementary relationship with QOUT. Also, as is understood from Table 1, when the two outputs are regarded as a differential output signal (QOUT-$\overline{QOUT}$), this configuration can be used to realize a two-quadrant multiplier which multiplies the positive charge signal QIN by positive and negative digital data, if an intermediate point between seven and eight is determined to be a median point, and values above this median point are corresponded to negative values, and values below the median point are corresponded to positive values.

Figure 7A:
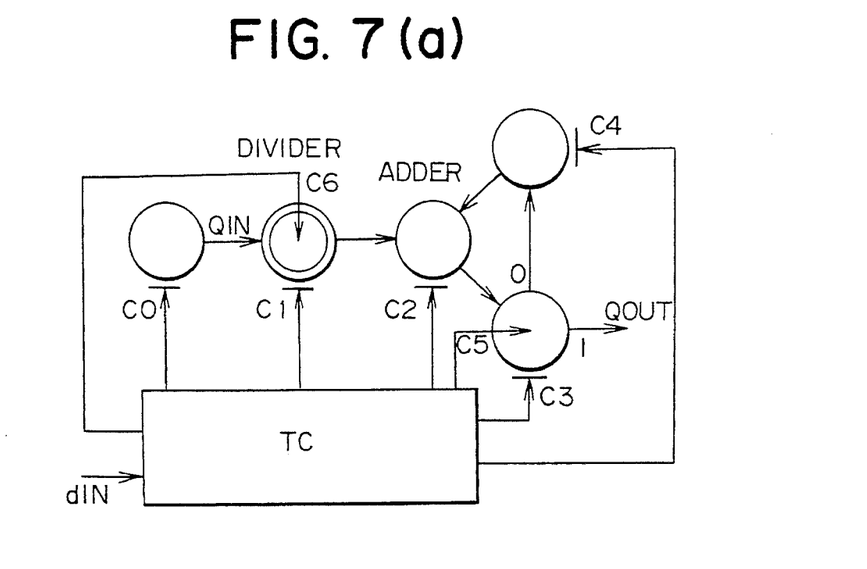
FIG. 7A shows another example of the configuration of a two-quadrant multiplier.

FIG. 7A shows another example of the configuration of a two-quadrant multiplier. In this example, the two-quadrant multiplier comprises a recursive shift register formed by three buffer gates including an adder, and each divided output of a recursive divider is added at timings controlled by a digital input dIN through a timing controller TC. One adder is utilized as two adders which are independent in the time domain. It should be noted that "independent in the time domain" means that the same hardware such as a memory, measuring means, or the like is used in a time shared manner. This configuration having only one signal path can eliminate causes of errors which would occur due to a plurality of signal paths.

Figure 7B:
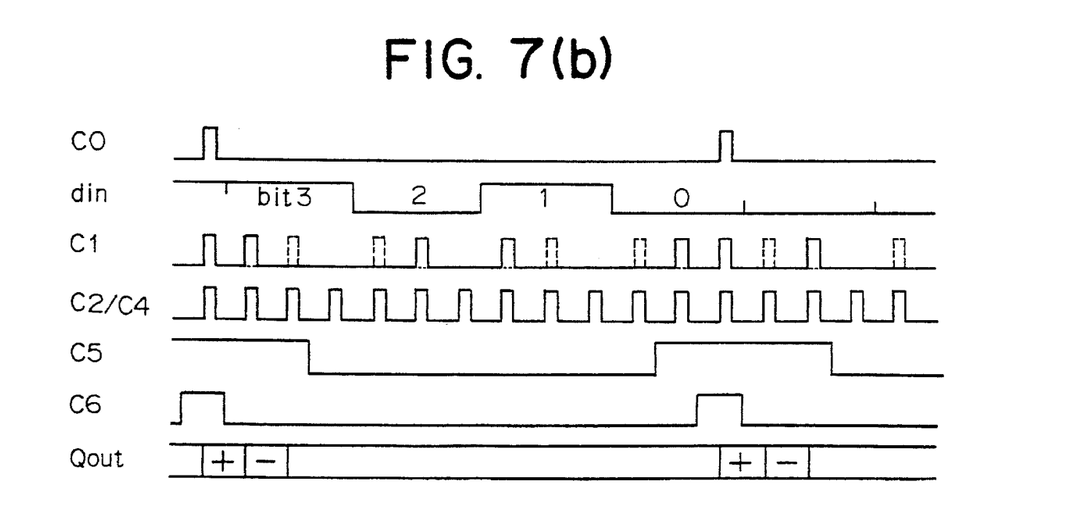
FIG. 7B represents the operation of the two-quadrant multiplier in time series.

FIG. 7B represents the operation of the two-quadrant multiplier in time series.

It will be appreciated in this example that signals C2, C3 and C4 are processed in synchronism, and these three kinds of signals recursively pass through each buffer gate. For this reason, a particular one of the three signals should be accessed by selecting one of three timings in time division manner. A virtual memory medium which continuously stores and shifts a particular signal on a recursive shift register as described above will hereinafter be referred to as a slot.

In FIG. 7B, an output timing C1 from the recursive divider is controlled by digital signal bit dIN such that the output signal of the recursive divider is selectively added to either of two different kinds of slots on the recursive shift register. In the timing chart of C1, solid-line pulses represents operation timings depending on the state of the digital input diN, while broken-line pulses represent operation timings independent of the same.

In this example, differential outputs similar to those of the example shown in FIG. 6 are delivered to the outside respectively at timings indicated by + and − in the timing chart of Qout.

Next, a four-quadrant multiplier according to the present invention will be described in connection with the configuration and operation principles thereof with reference to FIG. 8.

Figure 8:
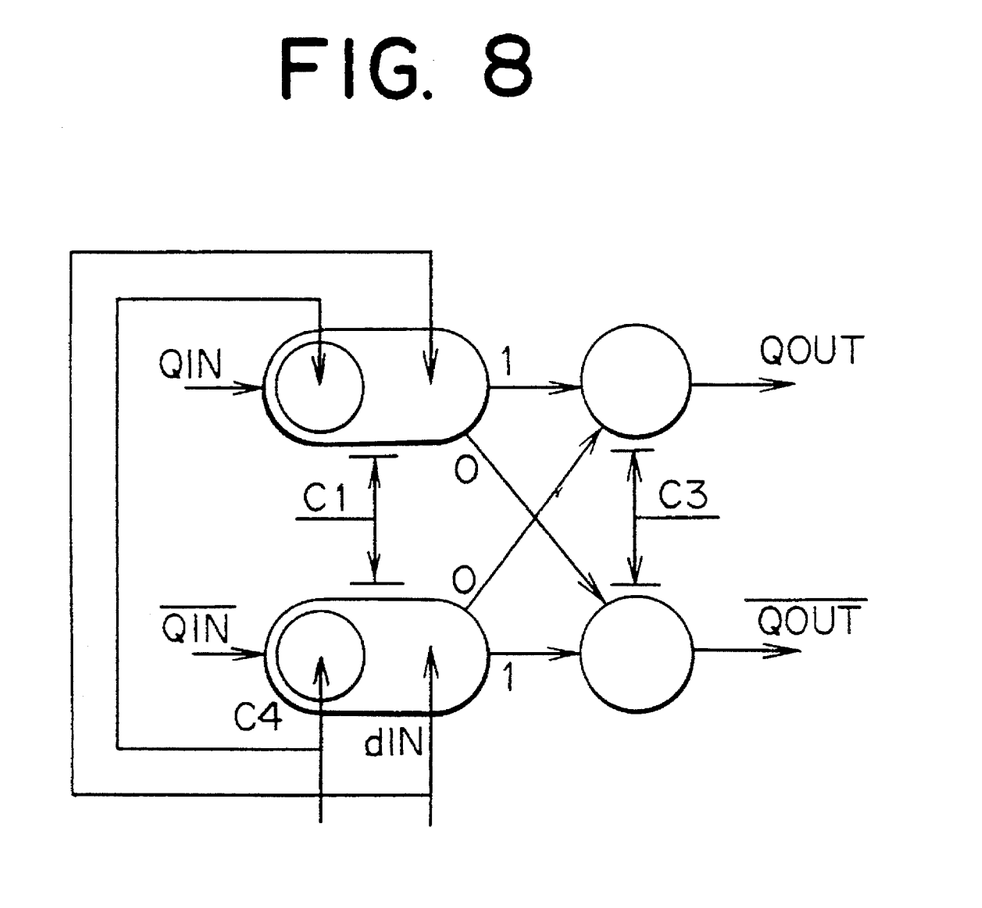
FIG. 8 shows an example of a four-quadrant multiplier which is configured by a couple of the multipliers shown in FIG. 6A.

FIG. 8 shows an example of a four-quadrant multiplier which is configured by a couple of the multipliers shown in FIG. 6A with two adders shared by these two multipliers. Differential inputs QIN, $\overline{QIN}$ are respectively held in recursive dividers independently of each other, the outputs of which are accumulated in the two adders depending on a digital input dIN.

Processing executed in each recursive divider corresponds to the processing expressed by the foregoing equations (7), (8) executed on each input, and as a result, four kinds of output signals expressed by equations (9)–(12) are generated:

$$QOUT1 = QIN \cdot \sum_{i=0}^{n-1} \{2^{(i-n)} \cdot di\} \quad (9)$$

$$QOUT0 = QIN \cdot \sum_{i=0}^{n-1} \{2^{(i-n)} \cdot (1 - di)\} \quad (10)$$

$$\overline{QOUT1} = \overline{QIN} \cdot \sum_{i=0}^{n-1} \{2^{(i-n)} \cdot di\} \quad (11)$$

$$\overline{QOUT0} = \overline{QIN} \cdot \sum_{i=0}^{n-1} \{2^{(i-n)} \cdot (1 - di)\} \quad (12)$$

Incidentally, QOUT0, $\overline{QOUT1}$ and QOUT1, $\overline{QOUT00}$ are respectively in relationship such that they are outputted to the same adder, so that their total outputs are expressed by equations (13), (14), respectively:

$$QOUT = QOUT1 + \overline{QOUT0} \quad (13)$$
$$= (QIN - \overline{QIN}) \cdot \sum_{i=0}^{n-1} \{2^{(i-n)} \cdot di\} + \overline{QIN} \cdot (1 - 2^{-n})$$

$$\overline{QOUT} = QOUT0 + \overline{QOUT1} \quad (14)$$
$$= (QIN - \overline{QIN}) \cdot$$
$$\sum_{i=0}^{n-1} \{2^{(i-n)} \cdot (1 - di)\} + \overline{QIN} \cdot (1 - 2^{-n})$$

Since the second term of the right side is common term in both the equations and is negligible because it has no meaning as a differential signal, the equations (13), (14) may be regarded as being identical to the equations (7), (8) with the exception that QIN is replaced with (QIN-$\overline{QIN}$).

It is therefore understood that a combination of the two two-quadrant multipliers represented by the equations (7), (8) can implement a four-quadrant multiplier.

From the foregoing, it will be appreciated that with the present invention, analog memories such as CCD, advantageous in less power consumption and higher integration density, may be used to configure a system for highly accurately executing the multiplication processing which has conventionally been relatively difficult.

The extremely simple configuration of the present invention may be effectively utilized for realizing a massively parallel analog processor as well as applied to other fields such as image processing by combining a function of an input means for optical signals, which has been a main application of the CCD.

It is also possible to effectively utilize the present invention as a multiplier element for directly realizing a function equivalent to the FIR type DSP, which has been executed by a combination of A/D conversion, digital operations and D/A conversion, by using analog signals without A/D and D/A conversions.

What is claimed is:

1. A charge signal equalizer device comprising;

a plurality of charge signal equalizers, wherein each of said charge signal equalizers is connected in cascadic manner so as to define a means for progressively improving the accuracy of an equalizing result.

2. A charge signal divider comprising:

a primary charge signal divider that includes an input port for receiving an input signal packet and divides said packet into two output signal packets; and means for equalizing a charge signal including a secondary charge signal divider that receives two output signal packets from said primary charge signal divider through an input port of the secondary charge signal divider.

3. A charge signal divider according to claim 2, wherein said primary charge signal divider and the secondary charge signal divider used in said charge signal equalizer utilize the same charge signal divider hardware and further comprising:

a feedback circuit that feeds two output signals from said primary charge signal divider serially back to the input port of the secondary charge signal divider used in said charge signal equalizer.

4. A digital to analog converter comprising:

at least one first analog memory means (X) having an input port for receiving input signal packets (Qin) and a partial output drive port for driving the i-th output signal packet (Qout(i)) defined by:

$$Qout(i)=Qin \bullet (1-a)^{i-1} \bullet a$$

where a is a value satisfying 1>a>0, and i=1, 2, 3 . . . ;

at least one second analog memory means (Y) having a function to integrate input signal packets applied thereto;

at least one signal packet routing mechanism for selectively routing output signal packets from said first analog memory means according to an input digital signal bit (d(i));

wherein said first analog memory means is a charge coupled device including a signal packet divider coupled to receive the input signal packets (Qin) for dividing each of said input signal packets into two parts (Q, Q') in a predetermined ratio and outputting the divided two parts therefrom and a signal packet feedback circuit for returning one of said two outputs to said first analog memory means as a new input signal packet; and said signal divider including feed-back circuits for feeding each of two output signal packets from said divider back to said signal divider such that said divider further divides said two signal packets into four parts; and adder means for adding said four parts in a predetermined relationship.

5. A digital to analog converter comprising:

at least one first analog memory means (X) having an input port for receiving input signal packets (Qin) and a partial output drive port for driving the i-th output signal packet (Qout(i)) defined by:

$$Qout(i)=Qin \bullet (1-a)^{i-1} \bullet a$$

where the value of a is equal to 0.5, and i=1, 2, 3 . . . ;

at least one second analog memory means (Y) having a function to integrate input signal packets applied thereto;

at least one signal packet routing mechanism for selectively routing output signal packets from said first analog memory means according to an input digital signal bit (d(i));

wherein said first analog memory means is a charge coupled device including a signal packet divider coupled to receive the input signal packets (Qin) for dividing each of said input signal packets into two parts (Q, Q') in a predetermined ratio and outputting the divided two parts therefrom and a signal packet feedback circuit for returning one of said two outputs to said first analog memory means as a new input signal packet; and said signal divider including feed-back circuits for feeding each of two output signal packets from said divider back to said signal divider such that said divider further divides said two signal packets into four parts; and adder means for adding said four parts in a predetermined relationship.

6. A digital to analog converter comprising:

at least one first analog memory means (X) having an input port for receiving input signal packets (Qin) and a partial output drive port for driving the i-th output signal packet (Qout(i)) defined by:

$$Qout(i)=Qin \bullet (1-a)^{i-1} \bullet a$$

where a is a value satisfying 1>a>0, and i=1, 2, 3 . . . ;

at least one second analog memory means (Y) having a function to integrate input signal packets applied thereto;

at least one signal packet routing mechanism for selectively routing output signal packets from said first analog memory means according to an input digital signal bit (d(i));

wherein said first and second analog memory means are charge transfer devices;

said first analog memory means is a charge coupled device including a signal packet divider coupled to receive the input signal packets (Qin) for dividing each of said input signal packets into two parts (Q, Q') in a predetermined ratio and outputting the divided two parts therefrom and a signal packet feed-back circuit for returning one of said two outputs to said first analog memory means as a new input signal packet; and said signal divider including feed-back circuits for feeding each of two output signal packets from said divider back to said signal divider such that said divider further divides said two signal packets into four parts; and adder means for adding said four parts in a predetermined relationship.

7. A digital to analog converter comprising:

at least one first analog memory means (X) having an input port for receiving input signal packets (Qin) and a partial output drive port for driving the i-th output signal packet (Qout (i)) defined by:

$$Qout(i)=Qin \bullet (1-a)^{i-1} \bullet a$$

where the value of a is equal to 0.5, and i=1, 2, 3 . . . ;

at least one second analog memory means (Y) having a function to integrate input signal packets applied thereto;

at least one signal packet routing mechanism for selectively routing output signal packets from said first analog memory means according to an input digital signal bit (d(i));

wherein said first and second analog memory means are charge transfer devices;

said first analog memory means is a charge coupled device including a signal packet divider coupled to receive the input signal packets (Qin) for dividing each of said input signal packets into two parts (Q, Q') in a predetermined ratio and outputting the divided two parts therefrom and a signal packet feed-back circuit for returning one of said two outputs to said first analog memory means as a new input signal packet; and said signal divider including feed-back circuits for feeding each of two output signal packets from said divider back to said signal divider such that said divider further divides said two signal packets into four parts; and adder means for adding said four parts in a predetermined relationship.

8. A digital to analog converter according to any one of claims 4–7, wherein said adder means adds a divided part of one of said two signal packets to a divided part of the other of said two signal packets, and the other divided part of the one signal packet to the other divided part of the other signal packet.

9. A charge signal equalizer comprising:

a charge signal divider that receives two input signal packets serially at an input port thereof and divides said two input signal packets into four output signal packets; and at least one adder means for adding two of said four output signal packets from said charge signal divider in a predetermined combination and outputting two resultant signal packets as output signal packets.

10. A charge signal equalizer according to claim 9, further comprising:

at least one signal feedback circuit that feeds each of two output signals from said charge signal equalizer back to the input port of said charge signal equalizer.

11. A charge signal equalizer according to claim 9, wherein said charge signal divider and adder means are charge coupled devices.

12. A digital to analog converter comprising:

(a) a recursive divider for driving the i-th output signal packet ($Q_{out}$ (i)) defined by:

$$Q_{out}(i)=Q_{in} \cdot 2^{-i}$$

where i= 1, 2, 3, . . . ;

(b) two analog memory means having a function to integrate input signal packets applied thereto; and (c) a signal packet routing mechanism for selectively routing output signal packets from said recursive divider to one of said two analog memory means according to input digital signal bits (d(i)) applied thereto;

in which said recursive divider has an input port for receiving an input signal packet ($Q_{in}$);

a primary charge signal divider X which divides said input signal packet into two parts;

at least one charge signal equalizer for receiving serially two output signal packets outputted from said primary charge signal divider or two output signal packets outputted from one of said charge signal equalizers as two input signal packets thereof and for eliminating difference between two input signal packets maintaining the sum of signal quantity of said two input signal packets;

a feedback circuit which feeds one of two outputs outputted from said charge signal equalizer back to the input port of said primary charge signal divider; and a partial output drive port which drives one of two outputs outputted from said charge signal equalizer;

wherein said charge signal equalizer has at least one secondary charge signal divider which receives two input signal packets to be equalized serially at the input port thereof and divides said two input signal packets into four output signal packets, and at least one adder means for adding two or four output signal packets outputted from said secondary charge signal divider in a pre-determined combination and outputting two resultant signal packets as output signal packets.

13. A digital to analog converter comprising:

(a) two recursive dividers each of which receives two input signal packets which form a differential signal to supply positive and negative reference signals, and for driving the i-th output signal packet ($Q_{out}$(i)) defined by;

$$Q_{out}(i)=Q_{in} \cdot 2^{-i}$$

where i= 1, 2, 3, . . . ;

(b) two analog memory means having a function to integrate input signal packets applied thereto; and (c) two signal packet routing mechanisms for selectively routing output signal packets from said two recursive dividers to one of said two analog memory means according to input digital signal bits (d(i)) applied thereto;

in which said recursive dividers have an input port for receiving input signal packet ($Q_{in}$);

a primary charge signal divider X, which divides said input signal packet into two parts;

at least one charge signal equalizer for receiving serially two output signal packets outputted from said primary charge signal divider or two output signal packets outputted from one of said charge signal equalizers as two input signal packets thereof and for eliminating difference between two input signal packets maintaining the sum of signal quantity of said two input signal packets;

a feedback circuit which feeds one of two outputs outputted from said charge signal equalizer back to the input port of said primary charge signal divider; and a partial output drive port which drives one of two outputs outputted from said charge signal equalizer;

wherein said charge signal equalizer has at least one secondary charge signal divider which receives two input signal packets to be equalized serially at the input port thereof and divides said two input signal packets into four output signal packets, and at least one adder means for adding two of said four output signal packets outputted from said secondary charge signal divider in a pre-determined combination and outputting two resultant signal packets as output signal packets.

14. A digital to analog converter according to claim 12 or 13 wherein said recursive divider is a charge coupled device.

15. A digital to analog converter according to claim 12 or 13 wherein said primary and secondary charge signal dividers utilize the same divider hardware and further comprising a feedback circuit feeding two output signal packets outputted from said divider hardware serially back to the input port of said divider hardware, wherein said output signal packets feedback by said feedback circuit are two output signal packets from said primary charge signal divider, or two output signal packets from said charge signal equalizer, and said feedback circuit utilizes the same feedback circuit hardware as the feedback circuit utilized for said recursive divider.

16. A digital to analog converter according to claim 12 or 13, wherein said two analog memory means are used to constitute a recursive shift-register, and an output of a recursive divider is added directly or indirectly to a slot on said recursive shift-register at a timing corresponding to a state of a digital signal bit for forming an output signal.

17. A digital to analog converter according to claim 12 or 13 wherein said two analog memory means are charge transfer devices.

18. A digital to analog converter according to claim 12, wherein said adder means adds a divided part of one of said two signal packets to a divided part of the other of said two signal packets, and the other divided part of the one signal packet to the other divided part of the other signal packet.

* * * * *